US007767261B2

(12) United States Patent
Kunze et al.

(10) Patent No.: US 7,767,261 B2
(45) Date of Patent: Aug. 3, 2010

(54) METHODS FOR FORMING PASSIVATED SEMICONDUCTOR NANOPARTICLES

(75) Inventors: Klaus Kunze, Half Moon Bay, CA (US); Scott Haubrich, Castro Valley, CA (US); Fabio Zurcher, Brisbane, CA (US); Brent Ridley, San Carlos, CA (US); Joerg Rockenberger, Redwood City, CA (US)

(73) Assignee: Kovio, Inc., Milpitas, CA (US)

( * ) Notice: Subject to any disclaimer, the term of this patent is extended or adjusted under 35 U.S.C. 154(b) by 0 days.

(21) Appl. No.: 12/261,002

(22) Filed: Oct. 29, 2008

(65) Prior Publication Data
US 2009/0053536 A1    Feb. 26, 2009

Related U.S. Application Data

(62) Division of application No. 11/373,696, filed on Mar. 10, 2006, now Pat. No. 7,553,545, which is a division of application No. 10/616,147, filed on Jul. 8, 2003.

(51) Int. Cl.
*B05D 5/00* (2006.01)
(52) U.S. Cl. ...................... 427/215; 427/220
(58) Field of Classification Search ............... 427/215, 427/220
See application file for complete search history.

(56) References Cited

U.S. PATENT DOCUMENTS 4,027,053 A    5/1977 Lesk
(Continued)

FOREIGN PATENT DOCUMENTS
EP    0 902 030 B1    8/1998
(Continued)

OTHER PUBLICATIONS

Shu-Man Liu, Yang, Seiichi Sato and Keisaku Kimura; "Enhanced Photoluminescene from Si Nano-organosols by Functionalization with Alkenes and Their Size Evolution"; Chemistry of Materials; 2006; pp. 637-642; American Chemical Society, Washington, DC.

(Continued)

*Primary Examiner*—H. (Holly) T Le
(74) *Attorney, Agent, or Firm*—The Law Offices of Andrew D. Fortney; Andrew D. Fortney

(57) ABSTRACT

Compositions, inks and methods for forming a patterned silicon-containing film and patterned structures including such a film. The composition generally includes (a) passivated semiconductor nanoparticles and (b) first and second cyclic Group IVA compounds in which the cyclic species predominantly contains Si and/or Ge atoms. The ink generally includes the composition and a solvent in which the composition is soluble. The method generally includes the steps of (1) printing the composition or ink on a substrate to form a pattern, and (2) curing the patterned composition or ink. In an alternative embodiment, the method includes the steps of (i) curing either a semiconductor nanoparticle composition or at least one cyclic Group IVA compound to form a thin film, (ii) coating the thin film with the other, and (iii) curing the coated thin film to form a semiconducting thin film. The semiconducting thin film includes a sintered mixture of semiconductor nanoparticles in hydrogenated, at least partially amorphous silicon and/or germanium. The thin film exhibits improved conductivity, density, adhesion and/or carrier mobility relative to an otherwise identical structure made by an identical process, but without either the semiconductor nanoparticles or the hydrogenated Group IVA element polymer. The present invention advantageously provides semiconducting thin film structures having qualities suitable for use in electronics applications, such as display devices or RF ID tags, while enabling high-throughput printing processes that form such thin films in seconds or minutes, rather than hours or days as with conventional photolithographic processes.

21 Claims, 4 Drawing Sheets

U.S. PATENT DOCUMENTS

| | | | |
|---|---|---|---|
| 4,052,430 | A | 10/1977 | Yajima et al. |
| 4,276,424 | A | 6/1981 | Peterson, Jr. et al. |
| 4,330,358 | A | 5/1982 | Grabmaier et al. |
| 4,407,858 | A | 10/1983 | Hanke et al. |
| 4,537,942 | A | 8/1985 | Brown-Wensley et al. |
| 4,554,180 | A | 11/1985 | Hirooka |
| 4,569,953 | A | 2/1986 | West et al. |
| 4,611,035 | A | 9/1986 | Brown-Wensley et al. |
| 4,683,145 | A | 7/1987 | Nishimura et al. |
| 4,683,146 | A | 7/1987 | Hirai et al. |
| 4,704,444 | A | 11/1987 | Brown-Wensley et al. |
| 4,726,963 | A | 2/1988 | Ishihara et al. |
| 4,759,947 | A | 7/1988 | Ishihara et al. |
| 4,818,560 | A | 4/1989 | Ishihara et al. |
| 4,820,788 | A | 4/1989 | Zeigler |
| 4,830,890 | A | 5/1989 | Kanai |
| 4,835,005 | A | 5/1989 | Hirooka et al. |
| 4,841,083 | A | 6/1989 | Nagai et al. |
| 4,851,297 | A | 7/1989 | Allen et al. |
| 4,868,014 | A | 9/1989 | Kanai et al. |
| 4,992,520 | A | 2/1991 | Zeigler |
| 5,262,357 | A | 11/1993 | Alivisatos et al. |
| 5,559,057 | A | 9/1996 | Goldstein |
| 5,576,248 | A | 11/1996 | Goldstein |
| 5,593,781 | A * | 1/1997 | Nass et al. .......... 428/403 |
| 5,711,803 | A | 1/1998 | Pehnt et al. |
| 5,719,076 | A | 2/1998 | Guha |
| RE36,314 | E | 9/1999 | Yamazaki et al. |
| 5,989,945 | A | 11/1999 | Yudasaka et al. |
| 6,268,041 | B1 * | 7/2001 | Goldstein .......... 428/208 |
| 6,355,198 | B1 | 3/2002 | Kim et al. |
| 6,541,354 | B1 | 4/2003 | Shimoda et al. |
| 6,593,591 | B2 | 7/2003 | Yudasaka et al. |
| 6,767,775 | B1 | 7/2004 | Yudasaka et al. |
| 6,867,442 | B2 * | 3/2005 | Halik et al. .......... 257/212 |
| 6,878,871 | B2 | 4/2005 | Scher et al. |
| 7,078,276 | B1 * | 7/2006 | Zurcher et al. .......... 438/151 |
| 7,247,384 | B2 * | 7/2007 | Cai et al. .......... 428/446 |
| 7,259,101 | B2 * | 8/2007 | Zurcher et al. .......... 438/700 |
| 7,267,721 | B2 * | 9/2007 | Kauzlarich et al. .......... 117/68 |
| 7,416,911 | B2 * | 8/2008 | Heath et al. .......... 438/49 |
| 7,422,708 | B2 * | 9/2008 | Kunze et al. .......... 252/521.3 |
| 7,491,642 | B2 * | 2/2009 | Lewis et al. .......... 438/642 |
| 7,553,545 | B2 * | 6/2009 | Kunze et al. .......... 428/446 |
| 2003/0034486 | A1 | 2/2003 | Korgel |
| 2003/0045632 | A1 | 3/2003 | Shiho et al. |
| 2003/0227116 | A1 | 12/2003 | Halik et al. |
| 2004/0248429 | A1 | 12/2004 | Aoki |
| 2005/0145163 | A1 | 7/2005 | Matsuki et al. |
| 2005/0176183 | A1 | 8/2005 | Aoki |
| 2005/0181566 | A1 | 8/2005 | Machida et al. |

FOREIGN PATENT DOCUMENTS

| | | |
|---|---|---|
| JP | 60-242612 | 12/1985 |
| JP | 6-191821 | 7/1994 |
| JP | 7-267621 | 10/1995 |
| JP | 9-45922 | 2/1997 |
| WO | 00/59014 | 10/2000 |
| WO | 00/59041 | 10/2000 |

OTHER PUBLICATIONS

Zhifeng Ding, Bernadette M. Quinn, Santash K Haram, Lindsay E. Pell, Brian A. Korgel and Allen J. Bard; "Electrochemistry and Electrogenerated Chemiluminescence from Silicon Nanocrystal Quantum Dots"; Science; 2002; pp. 1293-1297; vol. 296; American Association for the Advancement of Science, Washington, DC.

Justin D. Holmes, Kirk J. Ziegler, R. Christopher Doty, Lindsay E. Pell, Keith P. Johnston and Brian A. Korgel; "Highly Luminescent Silicon Nanocrystals with Discrete Optical Transitions"; Journal of American Chemical Society; 2001; pp. 3743-3748; vol. 123, No. 16; ACS Publications, Washington, DC.

J. P. Wilcoxon, P. P. Provencio and G. A. Samara; "Synthesis and Optical Properties of Colloidal Germanium Nanocrystals"; Physical Review B; 2001; pp. 035417-1-035417-9; vol. 64; The American Physical Society, College Park, MD.

J. P. Wilcoxon, G. A. Samara and P. N. Provencio; "Optical and Electronic Properties of Si Nanoclusters Synthesized in Inverse Micelles"; Physical Review B; 1999; pp. 2704-2714; vol. 60, No. 4; The American Physical Society, College Park, MD.

J. P. Wilcoxon and S. A. Craft; "Liquid Chromatographic Analysis and Characterization of Inorganic Nanoclusters"; NanoStructured Materials; 1997; pp. 85-88; vol. 9; Acta Metallurgica Inc., USA.

Gennadiy Belomoin, Joel Therrien and Munir Nayfeh; "Oxide and Hydrogen Capped Ultrasmall Blue Luminescent Si Nanoparticles"; Applied Physics Letters; 2000; pp. 779-781; vol. 77, No. 6; American Institute of Physics, Melville, NY.

L. Mitas, J. Therrien, R. Twesten, G. Belomoin and M. H. Nayfeh; "Effect of Surface Reconstruction on the Structural Prototypes of Ultrasmall Ultrabright Si29 Nanoparticles"; Applied Physics Letters; 2001; pp. 1918-1920; vol. 78, No. 13; American Institute of Physics, Melville, NY.

E. Rogozhina, G. Belomoin, A. Smith, L. Abuhassan, N. Barry, O. Akcakir, P. V. Braun and M. H. Nayfeh; "Si-N Linkage in Ultrabright, Ultrasmall Si Nanoparticles"; Applied Physics Letters; 2001; pp. 3711-3713; vol. 78, No. 23; American Institute of Physics, Melville, NY.

Zain Yamani, Sahel Ashhab, Ammar Nayfeh, W. Howard Thompson and Munir Nayfeh; "Red to Green Rainbow Photoluminescence from Unoxidized Silicon Nanocrystallites"; Journal of Applied Physics; 1998; pp. 3929-3931; vol. 83, No. 7; American Institute of Physics, Melville, NY.

J. Heitmann, R. Scholz, M. Schmidt, M. Zacharias; "Size Controlled nc-Si Synthesis by SiO/SiO2 Superlattices"; Journal of Non-Crystalline Solids 299-302; 2002; pp. 1075-1078; Elsevier Science B.V., Amsterdam, The Netherlands.

M. Schmidt, M. Zacharias, S. Richter, P. Fischer, P. Veit, J. Blasing and B. Breeger; "Er Doping of Nanocrystalline-Si/Si02 Superlattices"; Thin Solid Films; 2001; pp. 211-215; vol. 397; Elsevier Science B.V., Amsterdam, The Netherlands.

U. Kahler and H. Hofmeister; "Size Evolution and Photoluminescence of Silicon Nanocrystallites in Evaporated SiOx Thin Films upon Thermal Processing"; Applied Physics A; 2002; pp. 13-17; vol. 74; Springer-Verlag, New York, NY.

U. Kahler and H. Hofmeister; "Visible Light Emission from Si Nanocrystalline Composites via Reactive Evaporation of SiO"; Optical Materials; 2001; pp. 83-86; vol. 17; Elsevier Science B.V., Amsterdam, The Netherlands.

Mikito Mamiya, Humihiko Takei, Masae Kikuchi and Chiaki Uyeda; "Preparation of Fine Silicon Particles from Amorphous Silicon Monoxide by the Disproportionation Reaction"; Journal of Crystal Growth; 2001; pp. 457-461; vol. 229; Elsevier Science B.V., Amsterdam, The Netherlands.

Mikito Mamiya, First Last and First Last; "Crystallization of Fine Silicon Particles from Silicon Monoxide"; Journal of Crystal Growth; 2002; pp. 1909-1914; vol. 237-239; Elsevier Science B.V., Amsterdam, The Netherlands.

M. Zacharias, J. Heitmann, R. Scholz, U. Kahler, M. Schmidt and J. Blasing; "Size-Controlled Highly Luminescent Silicon Nanocrystals: a SiO/SiO2 Superlattice Approach"; Applied Physics Letters; 2002; pp. 661-663; vol. 80, No. 4; American Institute of Physics, Melville, NY.

L. A. Nesbit; "Annealing Characteristics of Si-Rich SiO2 Films"; Applied Physics Letters; 1985; pp. 38-40; vol. 46, No. 1; American Institute of Physics, Melville, NY.

G.W. Rubloff; "Defect Microchemistry in SiO2/Si Structures"; Journal of Vacuum Science Technology A; 1990; pp. 1857-1863; vol. 8, No. 3; American Vacuum Society, New York, NY.

M. Schmidt, J. Heitmann, R. Scholz and M. Zacharias; "Bright Luminescence from Erbium Doped nc-Si/SiO2 Superlattices"; Journal of Non-Crystalline Solids; 2002; pp. 678-682; vol. 299-302; Elsevier Science B. V., Amsterdam, The Netherlands.

Margit Zacharias and Peter Streitenberger; "Crystallization in the Limit of Ultra Thin Layers- A New Crystallization Model"; Materials Research Society; 2001; pp. F6.2.1-F6.2.6; vol. 638; Materials Research Society, Warrendale, PA.

M. Zacharias, J. Heitmann, M. Schmidt and P. Streitenberger; "Confinement Effects in Crystallization and Er Doping of Si Nanostructures"; Physica E; 2001; pp. 245-251; vol. 11; Elsevier Science B.V., Amsterdam, The Netherlands.

M. Zacharias and P. Streitenberger; "Crystallization of Amorphous Superlattices in the Limit of Ultrathin Films with Oxide Interfaces"; Physical Review B; 2000; pp. 8391-8396; vol. 62, No. 12; The American Physical Society, College Park, MD.

James T. C. Wojtyk, Kim A. Morin, Rabah Boukherroub, and Danial D. M. Wayner; "Modification of Porous Silicon Surfaces with Activated Ester Monolayers"; Langmuir; 2002; pp. 6081-6087; vol. 18, No. 16; American Chemical Society, Washington, DC.

Alexander B. Sieval, Ralf Linke, Han Zuilhof and Ernst J. R. Sudholter; "High-Quality Alkyl Monolayers on Silicon Surfaces"; Advanced Materials; 2000; pp. 1457-1460; vol. 12, No. 19; Wiley Interscience, Malden MA.

A. B. Sieval, A. L. Demirel, J. W. M. Nissink, M. R. Linford, J. H. van der Maas, W. H. de Jeu, H. Zuihof and E. J. R. Sudhlter; "Highly Stable Si-C Linked Functionalized Monolayers on the Silicon (100) Surface"; Langmuir; 1998; pp. 1759-1768; vol. 14, No. 7; American Chemical Society, Washington, DC.

Alexander B. Sieval, Vincent Vleeming, Han Zuilhof and Ernst J. R. Sudhlter; "An Improved Method for the Preparation of Organic Monolayers of 1-Alkenes on Hydrogen-Terminated Silicon Surfaces"; Langmuir; 1999; pp. 8288-8291; vol. 15, No. 23; American Chemical Society, Washington, DC.

Alexander B. Sieval, Ralf Linke, Gert Heij, Geert Meijer, Han Zuilhof and Ernst J. R. Sudhlter; "Amino-Terminated Organic Monolayers on Hydrogen-Terminated Silicon Surfaces"; Langmuir; 2001; pp. 7554-7559; vol. 17, No. 24; American Chemical Society, Washington, DC.

R. Boukherroub, S. Morin, D. D. M. Wayner, F. Bensebaa, G. I. Sproule, J.-M. Baribeau and D. J. Lockwood; "Ideal Passivation of Luminescent Porous Silicon by Thermal, Noncatalytic Reaction with Alkenes and Aldehydes"; Chemistry of Materials; 2001; pp. 2002-2011; vol. 13, No. 6; American Chemical Society, Washington, DC.

Rabah Boukherroub and Danial D. M. Wayner; "Controlled Functionalization and Multistep Chemical Manipulation of Covalently Modified Si(111) Surfaces"; Journal of the American Chemical Society; 1999; pp. 11513-11515; vol. 121, No. 49; American Chemical Society, Washington, DC.

James T. C. Wojtyk, Mauro Tomietto, Rabah Boukherroub, and Danial D. M. Wayner; "Reagentless' Micropatterning of Organics on Silicon Surfaces: Control of Hydrophobic/Hydrophilic Domains"; Journal of the American Chemical Society; 2001; pp. 1535-1536; vol. 123, No. 7; American Chemical Society, Washington, DC.

R. Boukherroub, S. Morin, F. Bensebaa and D. D. M. Wayner; "New Synthetic Routes to Alkyl Monolayers on the Si(111) Surface"; Langmuir; 1999; pp. 3831-3835; vol. 15, No. 11; American Chemical Society, Washington, DC.

Rabah Boukherroub, Sylvie Morin, Paula Sharpe and Danial D. M. Waynerphilippe Allongue; "Insights into the Formation Mechanisms of Si-OR Monolayers from the Thermal Reactions of Alcohols and Aldehydes with Si(111)-H"; Langmuir; 2000; pp. 7429-7434; vol. 16, No. 19; American Chemical Society, Washington, DC.

Jillian M. Buriak; "Organometallic Chemistry on Silicon and Germanium Surfaces"; Chemical Reviews; 2002; pp. 1271-1308; vol. 102, No. 5; American Chemical Society, Washington, DC.

Richard K. Baldwin, Katherine A Pettigrew, Eva Ratai, Matthew P. Augustine and Susan M. Kauzlarich; "Solution Reduction Synthesis of Surface Stabilized Silicon Nanoparticles"; Chem. Communication; 2002; pp. 1822-1823; RSC Publishing, London, United Kingdom.

Richard K. Baldwin, Katherine A Pettigrew, Jayne C. Garno, Phillip P. Power, Gang-yu Liu and Susan M. Kauzlarich; "Room Temperature Solution Synthesis of Alkyl-Capped Tetrahedral Shaped Silicon Nanocrystals"; Journal of the American Chemical Society; 2002; pp. 1150-1151; vol. 124, No. 7; American Chemical Society, Washington, DC.

Chung-Sung Yang, Susan M. Kauzlarich, Y. C. Wang and Howard W. H. Lee; "Photoluminescence as a Function of Aggregated Size from n-Butyl-Terminated Silicon Nanoclusters"; Journal of Cluster Science; 2000; pp. 423-431; vol. 11, No. 3; Plenum Publishing Corporation, New York, NY.

Chung-Sung Yang, Richard A. Bley, Susan M. Kauzlarich, Howard W. H. Lee and Gildardo R. Delgado; "Synthesis of Alkyl-Terminated Silicon Nanoclusters by a Solution Route"; Journal of the American Chemical Society; 1999; pp. 5191-5195; vol. 121, No. 22; American Chemical Society; Washington, DC.

Akira Watanabe, Mamoru Fujitsuka and Osamu Ito; "Micropatterning of SiO2 Film Using Organosilicon Nanocluster as a Precursor"; Thin Solid Films; 1999; pp. 13-18, vol. 354; Elsevier Science S.A., Austria.

Akira Watanabe, Masashi Unno, Fusao Hojo and Takao Miwa; "Silicon-Germanium Alloys Prepared by the Heat Treatment of Silicon Substrate Spin-Coated with Organo-Soluble Germanium Cluster"; Materials Letters; 2001; pp. 89-94; vol. 47; Elsevier Science B.V., Amsterdam, The Netherlands.

A. Watanabe, M. Unno, F. Hojo and T. Miwa; "Preparation of Germanium Thin Film by a Coating Technique Using a Soluble Organogermanium Cluster as a Precursor"; Journal of Materials Science Letters; 2001; pp. 491-493; vol. 20; Kluwer Academic Publishers, New York, NY.

Aaron Puzder, A. J. Williamson, Jeffrey C. Grossman and Giulia Galli; "Surface Chemistry of Silicon Nanoclusters"; Physical Review Letters; 2002; pp. 097401-1-097401-4; vol. 88, No. 9; The American Physical Society, College Park, MD.

S. Aihara, R. Ishii, M. Fukuhara, N. Kamata, D. Terunuma, Y. Hirano, N. Saito, M Aramata and S. Kashimura; "Electroreductive Synthesis and Optical Characterization of Silicon Nanoparticles"; Journal of Non-Crystalline Solids; 2001; pp. 135-138; vol. 296; Elsevier Science B.V., Amsterdam, The Netherlands.

Libing Zhang, Jeffery L. Cofferwei Xu and T. W. Zerda; "Luminescent Si Nanoparticles in Sol-Gel Matrices Stabilized by Amino Acids"; Chemistry of Materials; 1997; pp. 2249-2251; vol. 9, No. 11; American Chemical Society, Washington, DC.

G. Belomoin, J. Therrien, A. Smith, S. Rao, R. Twesten, S. Chaieb, M. H. Nayfeh, L. Wagner and L. Mitas; "Observation of a Magic Discrete Family of Ultrabright Si Nanoparticles"; Applied Physics Letters; 2002; pp. 841-843; vol. 80, No. 5; American Institute of Physics, Melville, NY.

Chung-Wei Lin, Shih-Yen Lin, Si-Chen Lee and Chih-Ta Chia; "Structural and Optical Properties of Silicon-Germanium Alloy Nanoparticles"; Journal of Applied Physics; 2002; pp. 2322-2325; vol. 91, No. 4; American Institute of Physics, Melville, NY.

Y. H. Tang, Y. F. Zhang, N. Wang, W. S. Shi, C. S. Lee, I. Bello and S. T. Lee; "Si Nanowires Synthesized from Silicon Monoxide by Laser Ablation"; Journal of Vacuum Science Technology B; 2001; pp. 317-319; vol. 19, No. 1; American Vacuum Society, New York, NY.

Fernando A. Reboredo and Giulia Galli; "Theory of Alkyl-Terminated Silicon Quantum Dots"; The Journal of Physical Chemistry B; 2005; pp. 1072-1078; vol. 109, No. 3; American Chemical Society, Washington, DC.

David E. Harwell, John C. Croney, Wenjie Qin, John T. Thornton, Jason H. Day, Evan K. Hajime and David M. Jameson; "Effects of Surface Passivation on Silicon Nanoparticle Photoluminescence"; Chemistry Letters; 2003; pp. 1194-1195; vol. 32, No. 12; The Chemical Society of Japan, Tokyo, Japan.

V. Kapaklis, C. Politis, P. Poulopoulos and P. Schweiss; "Photoluminescence from Silicon Nanoparticles Prepared from Bulk Amorphous Silicon Monoxide by the Disproportionation Reaction"; Applied Physics Letters; 2005; pp. 123114-1-123114-3; vol. 87; American Institute of Physics, Melville, NY.

Jing Zou, Richard K. Baldwin, Katherine A. Pettigrew and Susan M. Kauzlarich; "Solution Synthesis of Ultrastable Luminescent Siloxane-Coated Silicon Nanoparticles"; Nano Letters; 2004; pp. 1181-1186; vol. 4, No. 7; American Chemical Society, Washington, DC.

Shu-man Liu, Seiichi Sato and Keisaku Kimura; "Synthesis of Luminescent Silicon Nanopowders Redispersible to Various Solvents"; Langmuir; 2005; pp. 6324-6329; vol. 21, No. 14; American Chemical Society, Washington, DC.

Lindsay E. Pell, April. D. Schricker, Frederic V. Mikulec and Brian A. Korgel; "Synthesis of Amorphous Silicon Colloids by Trisilane Thermolysis in High Temperature Supercritical Solvents"; Langmuir; 2004; pp. 6546-6548; vol. 20, No. 16; American Chemical Society, Washington, DC.

Xuegeng Li, Yuanqing He and Mark T. Swihart; "Surface Functionalization of Silicon Nanoparticles Produced by Laser-Driven Pyrolysis of Silane followed by HF-HNO Etching"; Langmuir; 2004; pp. 4720-4727; vol. 20, No. 11; American Chemical Society, Washington, DC.

Michele L. Ostraat, Harry A. Atwater and Richard C. Flagan; "The Feasibility of Inert Colloidal Processing of Silicon Nanoparticles"; Journal of Colloid and Interface Science; 2005; pp. 414-421; vol. 283; Elsevier Inc.

Paul F. McMillan, Jan Gryko, Craig Bull, Richard Arledge, Anthony J. Kenyon and Barbara A. Cressey; "Amorphous and Nanocrystalline Luminescent Si and Ge Obtained via a Solid-State Chemical Metathesis Synthesis Route"; Journal of Solid State Chemistry; 2005; pp. 937-949; vol. 178; Elsevier Inc.

Johannes Heitmann, Frank Muller, Margit Zacharias and Ulrich Gosele; "Silicon Nanocrystals: Size Matters"; Advanced Materials; 2005; pp. 795-803; vol. 17, No. 7; Wiley Interscience, Malden MA.

R. S. Carter, S. J. Harley, P. P. Power and M. P. Augustine; "Use of NMR Spectroscopy in the Synthesis and Characterization of Air- and Water-Stable Silicon Nanoparticles from Porous Silicon"; Chemistry of Materials; 2005; pp. 2932-2939; vol. 17, No. 11; American Chemical Society, Washington, DC.

Fengjun Hua, Mark T. Swihart and Eli Ruckenstein; "Efficient Surface Grafting of Luminescent Silicon Quantum Dots by Photoinitiated Hydrosilylation"; Langmuir; 2005; pp. 6054-6062; vol. 21, No. 13; American Chemical Society, Washington, DC.

Bryan D. Rowsell and Jonathan G. C. Veinot; "Reductive Thermolysis of a Heterocyclic Precursor: A Convenient Method for Preparing Luminescent, Surfactant-Stabilized Silicon Nanoparticles"; Nanotechnology; 2005; pp. 732-736; vol. 16; IOP Publishing Ltd, UK.

Jamie H. Warner, Halina Rubinsztein-Dunlop and Richard D. Tilley; "Surface Morphology Dependent Photoluminescence from Colloidal Silicon Nanocrystals"; The Journal of Physical Chemistry B; 2005; pp. 19064-19067; vol. 109, No. 41; American Chemical Society, Washington, DC.

William D. Kirkey, Yudhisthira Sahoo, Xuegeng Li, Yuanqing He, Mark T. Swihart, Alexander N. Cartwright, Stanley Buckenstein and Paras N. Prasad; "Quasi-Reversible Photoluminescence Quenching of Stable Dispersions of Silicon Nanoparticles"; Journal of Materials Chemistry; 2005; pp. 2028-2034; vol. 15; The Royal Society of Chemistry, London, UK.

Mark T. Swihart; "Vapor-Phase Synthesis of Nanoparticles"; Current Opinion in Colloid and Interface Science; 2003; pp. 127-133; vol. 8; Elsevier Science Ltd.

Xuegeng Li, Yuanqing He, Suddha S. Talukdar and Mark T. Swihart; "Process for Preparing Macroscopic Quantities of Brightly Photoluminescent Silicon Nanoparticles with Emission Spanning the Visible Spectrum"; Langmuir; pp. 8490-8496; vol. 19, No. 20; American Chemical Society; Washington, DC.

* cited by examiner

METHODS FOR FORMING PASSIVATED SEMICONDUCTOR NANOPARTICLES

RELATED APPLICATION(S)

The present application is a divisional application of U.S. application Ser. No. 11/373,696, filed Mar. 10, 2006 now U.S. Pat. No. 7,553,545, which is a divisional application of U.S. application Ser. No. 10/616,147, filed Jul. 8, 2003. The present application may be related to U.S. Pat. No. 7,078,276, entitled "Nanoparticles and Method for Making the Same," which is incorporated herein by reference in its entirety.

FIELD OF THE INVENTION

The present invention generally relates to the field of semiconducting films. More specifically, embodiments of the present invention pertain to compositions and methods for forming a patterned semiconductor and/or semiconducting thin film and to patterned structures including such a film.

SUMMARY OF THE INVENTION

Embodiments of the present invention relate to semiconducting thin film structures and to compositions and methods for making semiconductor and/or semiconducting thin films. The compositions generally comprise (a) passivated semiconductor nanoparticles; and at least one of (b) a first cyclic Group IVA compound of the formula (1):

where n is from 3 to 12, $1 \leq x \leq 2$ and each A in formula (1) is independently Si or Ge; and (c) a second cyclic Group IVA compound of the formula (2):

where (m+p+q) is from 3 to 12, $0 \leq x \leq 2$, $0 \leq (y, z) \leq 2$ and $1 \leq (y+z) \leq 2$, $0 \leq w \leq 1$, at least one of p and q is at least 1 such that when p is at least 1, (z-y) is at least 1, each A in formula (2) is independently Si or Ge, Z is B, P or As, R' is R or H, and each R in formula (2) is independently alkyl, aryl, aralkyl, a halogen, $BH_sR''_{2-s}$, $PH_sR''_{2-s}$, $AsH_sR''_{2-s}$, or $AH_tR''_{3-t}$, where s is 0 to 2, t is 0 to 3, and R" is alkyl, aryl, aralkyl, a halogen, or $AH_3$, where A is as defined above.

The compositions may further comprise a solvent in which the above nanoparticles and compounds are soluble. The method of forming a patterned semiconductor thin film generally comprises the steps of (i) printing a semiconductor thin film composition in a pattern on a substrate, and (ii) curing the patterned semiconductor thin film composition. In the method, the semiconductor thin film composition generally comprises at least one of the first and second cyclic Group IVA compounds of the formulas (1) and (2) above. In an alternative embodiment, the method comprises (i) at least partially curing a thin film composition comprising semiconductor nanoparticles to form a semiconductor thin film lattice, (ii) coating the semiconductor thin film lattice with a composition comprising at least one cyclic Group IVA compound of the formula (1) and/or the formula (2), and (iii) curing the coated thin film lattice to form a semiconducting thin film. In a further alternative, the method comprises (i) at least partially curing a thin film composition comprising at least one cyclic Group IVA compound of the formula (1) and/or the formula (2), (ii) coating the (partially) cured thin film composition with an ink comprising semiconductor nanoparticles, and (iii) curing the coated, (partially) cured thin film composition to form a semiconducting thin film.

The structures generally comprise a pattern of semiconducting material on a substrate, the semiconducting material having improved electrical properties (e.g., conductivity/resistivity, resistance to electromigration, step coverage and/or uniformity), relative to structures made without either the present passivated nanoparticles or the mixture of compounds of the formulas (1) and (2). The semiconducting material generally comprises hydrogenated amorphous silicon and/or germanium (e.g., from curing and/or sintering the compounds of the formulas (1) and/or (2)) and/or polycrystalline silicon and/or germanium (e.g., a number of separate crystalline regions and/or phases of silicon and/or germanium from corresponding nanocrystals thereof). In preferred embodiments, the structure may be formed from the present composition and/or ink, and/or by the present method, as described herein.

The present invention advantageously provides printed thin film structures having improved physical and/or electrical properties (e.g., conductivity, density, adhesion and/or carrier mobility), relative to structures made from a nanoparticle ink without the compounds of the formulas (1) and (2). Printing a semiconductor thin film forms structures such as the present patterned thin film structure in minutes, rather than hours or days as with conventional photolithographic semiconductor processing. The present composition advantageously provides semiconducting thin film structures having qualities suitable for use in electronics applications, such as display devices or RF ID tags, while enabling high-throughput printing processes to be used for manufacturing such electronic devices.

These and other advantages of the present invention will become readily apparent from the detailed description of preferred embodiments below.

DETAILED DESCRIPTION OF THE PREFERRED EMBODIMENTS

Figure 1A:
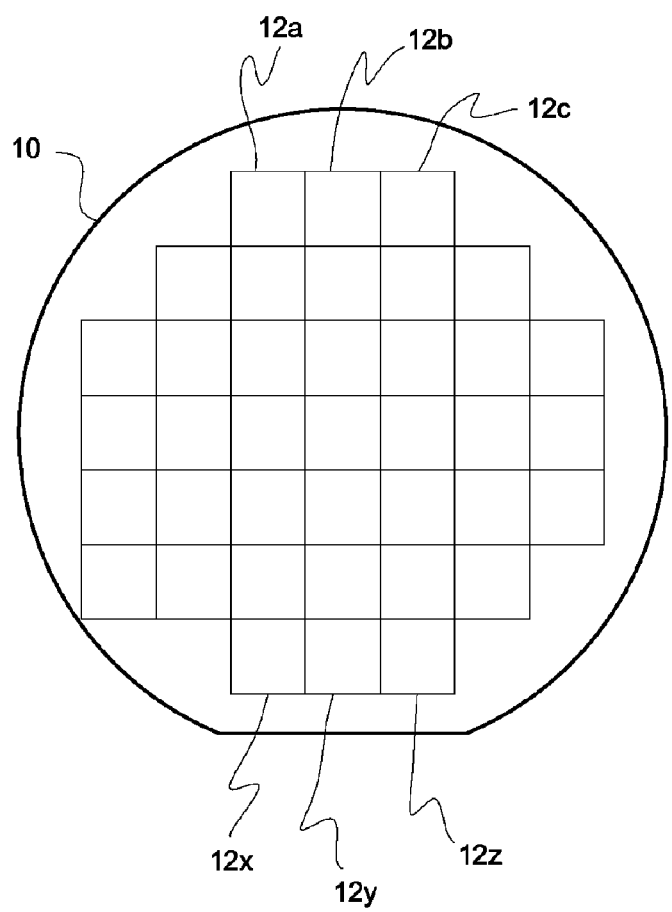
FIGS. 1A-B show embodiments of a substrate having a number of printing fields thereon.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

The present invention concerns a composition for making semiconductor and/or semiconducting thin films, comprising (a) passivated semiconductor nanoparticles; and at least one of (b) a first cyclic Group IVA compound of the formula (1):

$$(AH_x)_n \quad (1)$$

where n is from 3 to 12, $1 \leq x \leq 2$, and each A in formula (1) is independently Si or Ge; and (c) a second cyclic Group IVA compound of the formula (2):

$$(AH_x)_m(AH_yR_{z-y})_p(ZR'_w)_q, \quad (2)$$

where (m+p+q) is from 3 to 12, $0 \leq x \leq 2$, $0 \leq (y, z) \leq 2$ and $1 \leq (y+z) \leq 2$, $0 \leq w \leq 1$, at least one of p and q is at least 1 such that when p is at least 1, (z-y) is at least 1, each A in formula (2) is independently Si or Ge, Z is B, P or As, R' is R or H, and R in formula (2) is independently alkyl, aryl, aralkyl, a halogen, $BH_sR''_{2-s}$, $PH_sR''_{2-s}$, $AsH_sR''_{2-s}$, or $AH_tR''_{3-t}$, where s is 0 to 2, t is 0 to 3, and R'' is alkyl, aryl, aralkyl, a halogen, or $AH_3$ where A is as defined above.

A further aspect of the invention concerns an ink for printing a semiconductor and/or semiconducting thin film, including the inventive composition described herein and a solvent in which the composition is soluble. The ink may further comprise a surface tension reducing agent, a surfactant, a binder and/or a thickening agent, but may advantageously omit such additives or agents.

An even further aspect of the invention concerns a method of making a patterned semiconducting film, comprising the steps of: (a) printing a composition comprising at least one cyclic Group IVA compound of the formulas (1) and (2) above in a pattern on a substrate; and (b) curing the composition to form the patterned semiconducting film. Curing is generally conducted under conditions sufficient to form a doped or undoped polysilane, polygermane or germanium-substituted polysilane having a molecular weight sufficiently high and/or a chemical composition sufficiently insoluble to resist subsequent treatment with processing solvents (e.g., in subsequent cleaning and/or development steps). The composition to be printed may further comprise semiconductor nanoparticles, in which case curing may be conducted under conditions sufficient to form a hydrogenated, at least partially amorphous Group IVA element thin film structure. Printing may comprise nearly any known printing process or technique (e.g., embossing, stamping, stenciling, inkjet printing, screen printing, flexographic printing, offset lithography, gravure printing, selectively irradiating portions of the composition forming the pattern, etc.). Alternative embodiments involve separately depositing and/or curing one of (i) a cyclic Group IVA compound (or mixture thereof) or (ii) a silicon nanoparticle-containing ink, then depositing the other thereon and curing the resultant structure to form a semiconducting thin film, either as a printed pattern or a coherent thin film.

A still further aspect of the invention relates to a semiconducting thin film structure comprising a pattern of semiconducting material on a substrate, the semiconducting material comprising a hydrogenated amorphous Group IVA element, the Group IVA element comprising at least one of silicon and germanium, the semiconducting material having improved conductivity, density, adhesion and/or carrier mobility relative to an otherwise identical structure made by an identical process, but without either the passivated semiconductor nanoparticles or the mixture of first and second cyclic Group IVA compounds. In preferred embodiments, the structure may be formed by the present method as described herein.

The invention, in its various aspects, will be explained in greater detail below with regard to exemplary embodiments.

Exemplary Compositions

In one aspect, the present invention relates to a composition for forming semiconductor and/or semiconducting thin films, particularly patterned semiconducting thin films, and more particularly patterned silicon thin films. The composition generally comprises (a) passivated semiconductor nanoparticles; and at least one of (b) a first cyclic Group IVA compound of the formula (1) above and (c) a second cyclic Group IVA compound of the formula (2) above. In preferred embodiments, the formula (1) has the formula (3):

$$(AH_2)_n \quad (3)$$

and/or the second cyclic Group IVA compound of the formula (2) has the formula (4):

$$(AH_2)_m(AHR)_p(ZR')_q. \quad (4)$$

where n, m, p, q, R and R' are as described above.

In the compound of formula (1), each A in the formula is independently Si or Ge. Examples of suitable first cyclic Group IVA compounds can be found in U.S. Pat. Nos. 6,541,354, 6,527,847, 6,518,087, 6,514,801, 6,503,570, 5,866,471 and 4,683,145, and in U.S. Patent Application Publication 2003/0045632, the relevant portions of each of which are incorporated herein by reference, and include c-$(SiH_2)_3$, c-$(SiH_2)_4$, c-$(SiH_2)_5$, c-$(SiH_2)_6$, c-$(SiH_2)_7$, c-$(SiH_2)_8$, tetracyclo-$(SiH)_4$, pentacyclo-$(SiH)_6$, hexacyclo-$(SiH)_8$, c-$(SiH_2)_4$(GeH_2)$, c-$(SiH_2)_5$(GeH_2)$, c-$(SiH_2)_3$(GeH_2)_2$, c-$(SiH_2)_4$(GeH_2)_2$, c-$(SiH_2)_2$(GeH_2)_3$, c-$(SiH_2)(GeH_2)_4$, c-$(GeH_2)_5$, and mixtures thereof. Furthermore, in the compound of the formula (1), n is from 3 to 12, but is preferably 5 or 6. In other preferred embodiments, each A is Si. In one particularly preferred embodiment, n is 5, x is 2 and A is Si.

For example, the present composition may include a mixture of about 50 mol % c-$(SiH_2)_5$ and about 50 mol % c-$(SiH_2)_4(GeH_2)$ to provide a poly(germa)silane having a Si:Ge molar ratio of about 90:10 (depending on the amount and chemical identity of the compound of formula (2)) and a final amorphous semiconducting Si—Ge thin film structure having a Ge level between 1 and 10 mol %.

Similarly, in the compounds of the formulas (2) and/or (4), each A is independently Si or Ge. In preferred embodiments, each A is Si. Also similarly to formula (1), the sum of (m+p+q) is from 3 to 8, but is preferably 5 or 6. In one preferred embodiment, the sum of (m+p+q) is 5. At least one of p and q is at least 1, and preferably, p is 1 and q is 0. Furthermore, each R in the formula is alkyl, aryl, aralkyl, a halogen, $BH_sR''_{2-s}$, $PH_sR''_{2-s}$, $AsH_sR''_{2-s}$, or $AH_tR''_{3-t}$, where s is 0 to 2, t is 0 to 3, and R'' is alkyl, aryl, aralkyl, a halogen, or $AH_3$. Preferably, when q is 0, R is $AH_tR''_{3-t}$, and t is 3. Alternatively, when a p-doped semiconductor thin film structure is formed and/or desired, q is 1, Z is B and R' is hydrogen, alkyl, aryl or $SiH_3$; and when an n-doped semiconductor thin film structure is formed and/or desired, q is 1, Z is P or As, and R' is hydrogen, alkyl, aryl or $SiH_3$. However, most preferably, at least some part or portion of the compounds of formulas (2) and/or (4) will comprise a cyclic Group IVA compound in which R is $SiH_3$.

The compounds of the formulas (1) and (2) are made by conventional methods, such as those described in, e.g., U.S. Pat. Nos. 4,554,180, 4,683,145, 4,820,788 and 6,503,570, and in, e.g., Kumada, *J. Organomet. Chem.*, 100 (1975) 127-138, Ishikawa et al., *Chem. Commun.*, (1969) 567, Hengge et al., *J. Organomet. Chem.*, 212 (1981) 155-161, Hengge et al., *Z. Anorg. Allg. Chem.*, 459 (1979) 123-130, and Hengge et al., *Monatshefte für Chem.*, 106 (1975) 503-512, the relevant portions of which are incorporated herein by reference. Furthermore, the methods disclosed in any one of these references may be modified as suggested and/or disclosed in another of these references. However, the preferred method comprises reducing and oligomerizing $AR^7{}_2X_2$ (where $R^7$ is, e.g., phenyl or methyl), followed by treatment with a mixture of a Lewis acid and a hydrogen halide, such as $AlCl_3$ and HCl gas, then reduction with lithium aluminum hydride (optionally, in the presence of silica gel) to form a mixture of c-$(AH_2)_5$ and c-$(AH_2)_4(AH(AH_3))$ (see, e.g., U.S. Pat. No. 6,503,570 and Hengge et al., *Monatshefte für Chem.*, 106 (1975) 503-512). The added advantage of the preferred method is the formation of c-$(AH_2)_4(AH(AH_3))$ as a by-product. These methods are also generally effective for making compounds of the formula (2) where q is at least 1, or where R or R' is $BH_sR''_{2-s}$, $PH_sR''_{2-s}$, or $AsH_sR''_{2-s}$.

In the present composition, the passivated semiconductor nanoparticles generally comprise semiconductor nanoparticles and a passivation layer thereon. The nanoparticles may include amorphous and/or crystalline particles. The passivation layer may be chemically bound to the semiconductor nanoparticles by covalent bonds (e.g., a direct silicon-hydrogen, silicon-oxygen or silicon-carbon bond), by coordination bonds, by hydrogen-bonding, by Van der Waals forces and/or by ionic bonds. In preferred embodiments, the semiconductor nanoparticles comprise silicon, germanium or SiGe nanoparticles, which may be doped or undoped (e.g., intrinsic). Doped nanoparticles are described in U.S. Pat. Nos. 6,200,508 and 6,072,716, both to Jacobson et al., the relevant portions of which are incorporated herein by reference. Preferably, the passivation layer comprises one or more of the following: (i) an alcohol and/or alcoholate; (ii) a thiol and/or thiolate; (iii) an $AR'_3$ group, where A and R' are as described above; (iv) an alkyl, aryl and/or aralkyl group; (v) hydrogen; (vi) a halogen, such as F, Cl, Br, and/or I; and/or (vii) a surfactant, such as an amine, an amine oxide, a quaternary ammonium salt, a betaine, a sulfobetaine, an ether, a polyglycol, a polyether, a polymer, an organic ester, a phosphine, a phosphate, a sulfonic acid, a sulfonate, a sulfate, a ketone, and/or a silicone. More preferred passivation comprises (i) an alcohol and/or alcoholate; (ii) a thiol and/or thiolate; or (iii) an $AR'_3$ group, where A and R' are as described above. Exemplary semiconductor nanoparticles are described in U.S. Pat. No. 7,078,276, entitled "Nanoparticles and Method for Making the Same," which is incorporated herein by reference in its entirety.

In preferred embodiments, the alcohol and/or alcoholate may comprise a $C_4$-$C_{20}$, branched or unbranched, saturated or unsaturated aliphatic alcohol or salt thereof (such as butanol, hexanol, octanol, decanol, dodecanol, tetradecanol, hexadecanol, 2-butenol, 3-butenol, 2-hexenol, 4-hexenol, 5-hexenol, 2-octenol, 6-octenol, 7-octenol, 2-decenol, 9-decenol, 10-decenol, 2-dodecenol, 11-dodecenol, 2-tetradecenol, 13-tetradecenol, 2-hexadecenol, 15-hexadecenol, oleyl alcohol, linoleyl alcohol, linolenyl alcohol, elaidyl alcohol, behenyl alcohol, eleostearyl alcohol and/or arachidonyl alcohol); or a $C_7$-$C_{17}$, branched or unbranched, substituted or unsubstituted aralkanol or salt thereof (such as benzyl alcohol, $C_1$-$C_6$ alkyl-substituted benzyl alcohol, or a salt thereof). Polyols, such as long-chain alkanediols (e.g., 1,7-octanediol, 1,12-dodecanediol), in an amount of, e.g., 1-10 mol % may cross-link two or more silicon nanoparticles. Similarly, the preferred thiol and/or thiolate may comprise a $C_4$-$C_{20}$, branched or unbranched, saturated or unsaturated aliphatic thiol or salt thereof (such as butanethiol, hexanethiol, octanethiol, decanethiol, dodecanethiol, tetradecanethiol, hexadecanethiol, 2-butenethiol, 3-butenethiol, 2-hexenethiol, 4-hexenethiol, 5-hexenethiol, 2-octenethiol, 6-octenethiol, 7-octenethiol, 2-decenethiol, 9-decenethiol, 10-decenethiol, 2-dodecenethiol, 11-dodecenethiol, 2-tetradecenethiol, 13-tetradecenethiol, 2-hexadecenethiol and/or 15-hexadecenethiol); or a $C_7$-$C_{17}$, branched or unbranched, substituted or unsubstituted aralkanethiol or salt thereof (such as benzyl mercaptan, $C_1$-$C_6$ alkyl-substituted benzyl mercaptan, or a salt thereof). Unsaturated alcohols and/or thiols, particularly long-chain (e.g., $C_8$-$C_{20}$) unsaturated alcohols and/or thiols, may provide a mechanism or means by which passivated nanoparticles can be crosslinked with ultraviolet radiation. When such nanoparticles are selectively irradiated with an appropriate wavelength of UV light (e.g., through a mask), portions of the nanoparticle-containing composition may be crosslinked, while non-irradiated portions are not. These non-irradiated portions may then be removed with an appropriate solvent (e.g., see the discussion relating to "Exemplary Methods" below) to leave a patterned composition on the substrate.

The surfactant in preferred embodiments of the present composition may comprise a tri-$C_1$-$C_{20}$ alkyl-substituted amine, a tri-$C_1$-$C_{20}$ alkyl-substituted amine oxide, a tetra-$C_1$-$C_{20}$ alkyl-substituted quaternary ammonium salt, a conventional betaine, a conventional sulfobetaine, a polyglycol of the formula H—(—$OCH_2CH_2$—)$_a$—OH (where $2 \leq a \leq 4$), a polyether of the formula $R^3$—(—$OCH_2CH_2$—)$_a$—$OR^4$ (where $R^3$ and $R^4$ are independently a $C_1$-$C_4$ alkyl group), a $C_4$-$C_{20}$ branched or unbranched, saturated or unsaturated aliphatic carboxylic acid ester of a $C_1$-$C_4$ alcohol or of the alcohols described in the above paragraph, a $C_4$-$C_{20}$ aliphatic carboxylic acid thioester of a $C_1$-$C_4$ thiol or of the thiols described above, a tri-$C_1$-$C_{20}$ alkyl- or triaryl-substituted phosphine (such as trimethyl phosphine, triethyl phosphine, or triphenyl phosphine), a tri-$C_1$-$C_{20}$ alkyl- or triaryl-substituted phosphate, a di-$C_1$-$C_{20}$ alkyl- or diaryl-substituted phosphate salt, an aryl or $C_4$-$C_{20}$ branched or unbranched, saturated or unsaturated aliphatic sulfonic acid, an aryl or $C_4$-$C_{20}$ branched or unbranched, saturated or unsaturated aliphatic sulfonate, a di-$C_1$-$C_{20}$ alkyl sulfate, a $C_1$-$C_{20}$ alkyl sulfate salt, a ketone of the formula $R^5(C=O)R^6$ (where $R^5$ and $R^6$ are independently a $C_1$-$C_{20}$ alkyl or $C_6$-$C_{10}$ aryl group), and/or a conventional silicone. Surfactants are a preferred additive when hydrogen- and/or halogen-passivated nanoparticles are used, as they may facilitate or enable dispersion of such nanoparticles into aprotic and/or relatively nonpolar solvents.

In a preferred embodiment, the passivated semiconductor nanoparticles comprise alkyl-terminated silicon nanoparticles. The alkyl-terminated silicon nanoparticles can be prepared by reacting conventional hydrogen-terminated silicon nanoparticles (e.g., as isolated from an etch step as described in U.S. Pat. No. 7,078,276, entitled "Nanoparticles and Method for Making the Same") with an alkene (conventionally known as a "hydrosilylation reaction"). More specifically, alkenes suitable for use in the present hydrosilylation reaction include $C_4$-$C_{20}$ branched or unbranched alkenes, such as 1-hexene, 4-methylpentene, 3,3-dimethylbutene, 1-octene, 1-decene, 1-dodecene, 1-tetradecene, 1-hexadecene, 1-octadecene, 1-eicosene, and combinations thereof. Polyunsaturated alkenes, such as long-chain alkadienes (e.g., 1,17-octadecadiene), in an amount of, e.g., 1-10 mol % may cross-link two or more silicon nanoparticles. In a sufficiently high concentration in the alkene mixture, long-chain alkadienes may provide a cross-linked matrix of alkyl-passivated silicon nanoparticles in the present hydrosilylation reaction. The alkyl-terminated silicon nanoparticles produced by this reaction have a direct, covalent Si—C bond between the outermost silicon atoms and the alkyl groups of the passivation layer. The alkyl termination improves the nanoparticles' solubility in apolar or nonpolar organic solvents, such as $C_6$-$C_{20}$ branched or unbranched alkanes, $C_1$-$C_6$ branched or unbranched alkanes substituted with one or more halogens, $C_6$-$C_{20}$ branched or unbranched alkenes, $C_2$-$C_6$ branched or unbranched alkenes substituted with one or more halogens, $C_5$-$C_{20}$ branched or unbranched cyclic alkanes and alkenes, $C_5$-$C_{20}$ branched or unbranched cyclic alkanes and alkenes substituted with one or more halogens, $C_6$-$C_{10}$ arenes, $C_6$-$C_{10}$ arenes substituted with one or more $C_1$-$C_6$ branched or unbranched alkyl groups and/or halogens, a di-$C_1$-$C_{10}$ alkyl ether (but in the case where one of the alkyl groups is methyl, the other comprises at least a $C_4$ alkyl group), and/or a $C_4$-$C_{10}$ cyclic alkyl ether (such as tetrahydrofuran or dioxane).

In a further embodiment, the passivated semiconductor nanoparticles and/or the silicon nanoparticles have an average diameter of less than 5 nm, preferably less than 4 nm, more preferably about or less than 3.5 nm. Alternatively, the passivated semiconductor nanoparticles and/or the silicon nanoparticles may have a size distribution range such that at least 90% (preferably, at least 95% and more preferably, at least 98%) of the nanoparticles have a diameter of from 0.1 nm to 10 nm, preferably from 0.2 nm to 5 nm, more preferably from 0.5 nm to less than 5 nm. The (average) diameter may be for the passivated nanoparticles, but preferably, it is an (average) particle diameter of the unpassivated semiconductor nanoparticle core.

Exemplary Inks

In another aspect, the present invention concerns an ink for printing a semiconductor and/or semiconducting thin film. The ink may comprise or consist essentially of the exemplary composition described above. Where the ink consists essentially of the above composition, the compounds of the formulas (1) and/or (2) also function as a solvent for the passivated semiconductor nanoparticles. Alternatively, the ink may include, for example, the exemplary composition described above and a solvent in which the composition is soluble. In such an embodiment, the passivated semiconductor nanoparticles, and the first cyclic Group IVA compound and/or second cyclic Group IVA compound may each be present in the ink in a percentage by weight of from 0.1% to 50%, more preferably from 0.5 to 30 wt. %, and even more preferably from 1.0 to 20 wt. %. Furthermore, in any ink formulation, the ratio by weight of passivated semiconductor nanoparticles to the first and second cyclic Group IVA compounds may range from 0.01% to 99.9%, preferably from 0.1% to 90%, more preferably from 1.0% to 75%, and even more preferably from 10% to 50%.

In further embodiments, the solvent in the present ink comprises an aprotic solvent and/or an apolar solvent. In the context of the present invention, an "apolar" solvent is one that may have a gas-phase dipole moment of about 2 debyes or less, preferably about 1 debye or less, and even more preferably about 0.5 debye or less. In many implementations, an apolar solvent has a dipole moment of about 0 debyes, due to its molecular symmetry (e.g., carbon tetrachloride, tetrachloroethylene, benzene, p-xylene, dioxane) or highly covalent nature of the chemical bonds therein (e.g., mineral spirits, hexane, cyclohexane, toluene). In some embodiments, the present ink comprises a solvent having a boiling point of about or less than 250° C., preferably about or less than 200° C., and more preferably about or less than 150° C., at atmospheric pressure.

Exemplary solvents for the present ink composition include alkanes (e.g., $C_5$-$C_{12}$ branched or unbranched alkanes and cycloalkanes), alkenes (e.g., $C_6$-$C_{12}$ branched or unbranched alkenes and cycloalkenes), halogenated alkanes (e.g., $C_1$-$C_4$ alkanes having from 1 to 2n+2 halogen substituents and $C_3$-$C_6$ cycloalkanes having from 1 to 2n halogen substituents such as fluorine, chlorine and/or bromine, where n is the number of carbon atoms; preferably $C_1$-$C_2$ alkanes having from 2 to 2n+2 fluorine and/or chlorine substituents), halogenated alkenes (e.g., $C_2$-$C_4$ alkenes having from 1 to 2n halogen substituents and $C_3$-$C_6$ cycloalkenes having from 1 to 2n−2 halogen substituents such as fluorine, chlorine and/or bromine, where n is the number of carbon atoms; preferably $C_2$-$C_3$ alkenes having from 2 to 2n fluorine and/or chlorine substituents), arenes (e.g., benzene), substituted arenes (e.g., N-methylpyrrole or $C_6$-$C_{10}$ arenes having from 1 to 8 halogen substituents and/or $C_1$-$C_4$ alkyl and/or alkoxy substituents; preferably benzenes having from 1 to 6 fluorine, chlorine, $C_1$-$C_2$ alkyl and/or methoxy substituents), aliphatic ethers (e.g., ethers having two $C_2$-$C_6$ branched or unbranched alkyl groups, or 1 methyl group and one $C_4$-$C_6$ branched or unbranched alkyl group), cyclic ethers (e.g., tetrahydrofuran or dioxane), glycol ethers (e.g., of the formula $(CH_3(CH_2)_w)O((CH_2)_xO)_y(CH_2)_zCH_3)$, where x is independently 2-4 [preferably 2], y is 1-4 [preferably 1 or 2], and w and z are independently 0 to 3 [preferably 0]), and aliphatic esters (e.g., $C_1$-$C_6$ branched or unbranched alkyl esters of a $C_2$-$C_{20}$ branched or unbranched, saturated or unsaturated aliphatic acid), and polar aprotic solvents (such as aliphatic sulfoxides; e.g., dimethylsulfoxide).

The present ink may further comprise a surface tension reducing agent, a wetting agent, a surfactant, a binder and/or a thickening agent, although no such additives are required. In fact, it is advantageous for the ink to exclude such additional components, particularly where such additional components include sufficiently high molar proportions of elements such as carbon, oxygen, sulphur, nitrogen, halogen or heavy metals to significantly adversely affect electrical properties of the printed thin film. However, where they are present, each of these additional components may be present in trace amounts in the present ink composition. However, the surface tension reducing agent, which is conventional, may be present in an amount of from 0.01 wt. % to 1 wt. %, preferably 0.02 wt. % to 0.1 wt. % of the ink composition. In certain embodiments, the surface tension reducing agent may comprise a conventional hydrocarbon surfactant, a conventional fluorocarbon surfactant or a mixture thereof. The wetting agent is generally present in an amount of from 0.05 wt. % to 1 wt. %, preferably 0.1 wt. % to 0.5 wt. % of the ink composition. In certain embodiments, the wetting agent comprises a fluorinated surfactant and/or a fluorinated hydrocarbon, as described in U.S. Pat. No. 7,078,276, entitled "Nanoparticles and Method for Making the Same." The surfactant, which may be selected from those described above for the passivation layer, may be present in an amount of from 0.01 wt. % to 1 wt. %, preferably 0.05 wt. % to 0.5 wt. % of the ink composition. The binder and/or thickening agent, each of which is conventional, may be present in an amount sufficient to provide the ink composition with predetermined flow properties at a given processing temperature. However, typical amounts of these components in the composition are from 0.01 wt. % to 10 wt. %, preferably 0.1 wt. % to 5 wt. %

Exemplary Methods of Printing a Patterned Semiconductor Thin Film

The present invention further relates to method of making a patterned semiconductor and/or semiconducting film, comprising the steps of: (a) printing a composition comprising first and second cyclic Group IVA compounds of the formulas (1) and (2) above, and (b) curing the composition to form the patterned semiconducting film. In preferred embodiments, the composition further comprises semiconductor nanoparticles, more preferably passivated semiconductor nanoparticles. In certain implementations, the semiconductor nanoparticles comprise silicon nanoparticles.

Figure 1B:
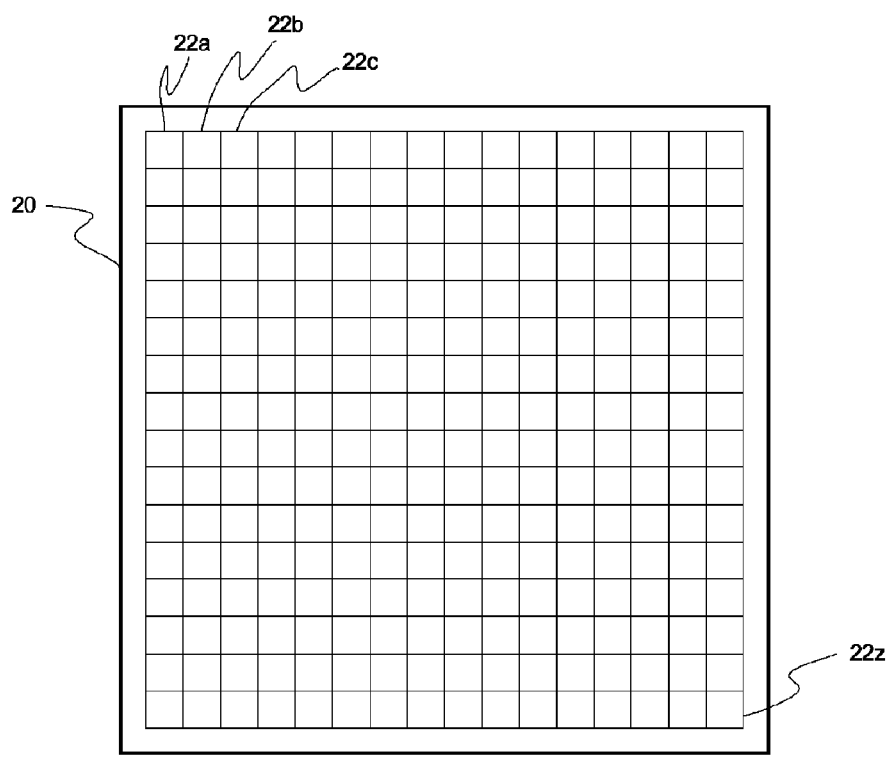

The printing step in the present method may comprise nearly any known printing method. For example, printing may be conducted by embossing, which generally comprises the substeps of (i) depositing a liquid layer of the composition on the substrate, and (ii) embossing the liquid layer. More specifically, as shown in FIG. 1A, a substrate 10 may comprise a semiconductor (preferably, silicon) wafer with a two-dimensional array of fields 12a-12z thereon. Alternatively, as shown in FIG. 1B, a substrate 20 may comprise a transparent or translucent display window 20 with a two-dimensional array of fields 22a-22z thereon. The fields may correspond, for example, to a circuit, a circuit element, an integrated circuit or a circuit block within an integrated circuit. While square or rectangular fields are shown in FIGS. 1A-1B to maximize the potential surface area for printing patterned structures, a field may take any shape amenable to a "step-and-repeat" printing process. In certain embodiments, the substrate may comprise a transparent glass or plastic display window (e.g., substrate 20 in FIG. 1B), and the circuit, circuit element, integrated circuit or block thereof may comprise a thin film transistor (TFT) display element. Alternatively, the substrate may comprise a silicon wafer (e.g., substrate 10 in FIG. 1A), and the circuit, circuit element, integrated circuit or block thereof may comprise a radio frequency identification circuit (e.g., a so-called RF ID tag or device).

Liquid embossing is suitable for patterning the present composition and/or ink particularly when an appropriate stamp material is chosen (see, e.g., U.S. patent application Ser. No. 10/251,103, filed Sep. 20, 2002, and entitled "Methods for Patterning Using Liquid Embossing"; U.S. patent application Ser. No. 10/288,357, filed Nov. 4, 2002, and entitled "Controlled Print Methods"; and U.S. patent application Ser. No. 10/288,359, filed Nov. 4, 2002, and entitled "Controlled Print Methods", each of which is incorporated herein by reference). Other liquid deposition and/or patterning techniques are also applicable, such as ink-jet printing, screen printing, gravure printing, offset lithography, flexographic printing, spin-coating, dip-coating, spray-coating, etc. Once the composition and/or ink coats the substrate, other techniques for patterning the composition and/or ink may include laser writing, exposure to UV light through a patterned mask, etc. Also, traditional photolithography and etching can be used on the present semiconductor thin films deposited from passivated semiconductor nanoparticles and/or one or more of the cyclic Group IVA compounds of the formulas (1) and (2) described above. The only requirement for the present printing step is that deposition, patterning and curing take place in an inert or reducing atmosphere.

Figure 2A:
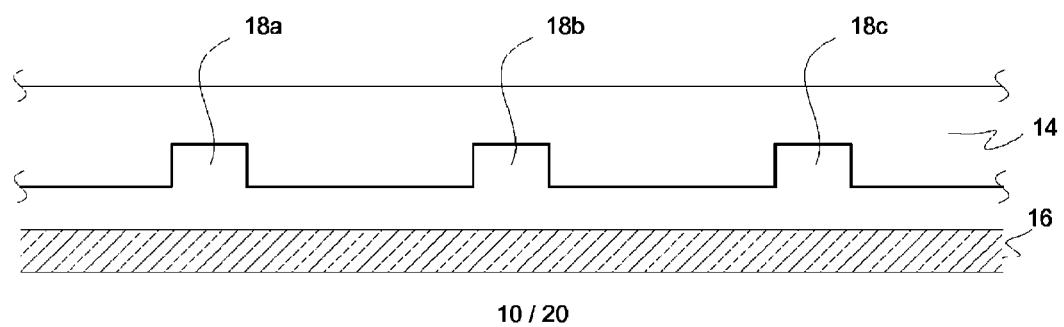
FIGS. 2A-B are cross-sectional views of an embodiment for making a semiconducting thin film structure according to the present invention.
Figure 2B:
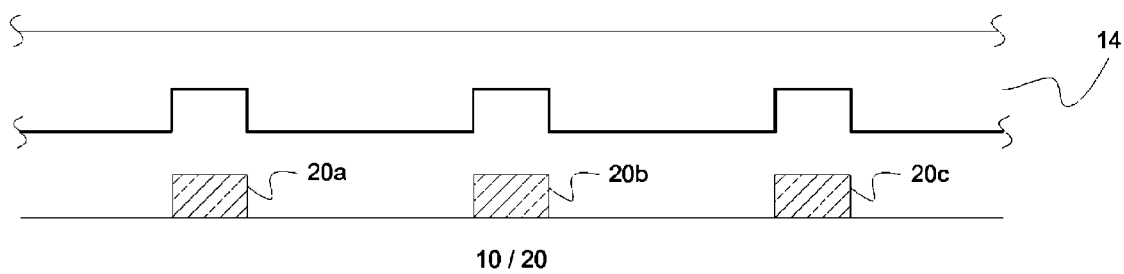

As shown in part in FIG. 2A, the embossing substep may comprise contacting a stamp 14 with the layer 16 in one or more fields on the substrate 10/20, then repeating the contacting step in one or more different or next fields on the substrate, preferably until all fields in which the pattern is to be formed have been contacted with the stamp 14. In general, stamp 14 has features 18a-18c therein corresponding to the pattern, a partial cross section of which is shown in FIG. 2B and which comprises patterned structures 20a-20c. Patterned structures 20a-20c are generally the structures resulting from the contacting step.

Figure 3:
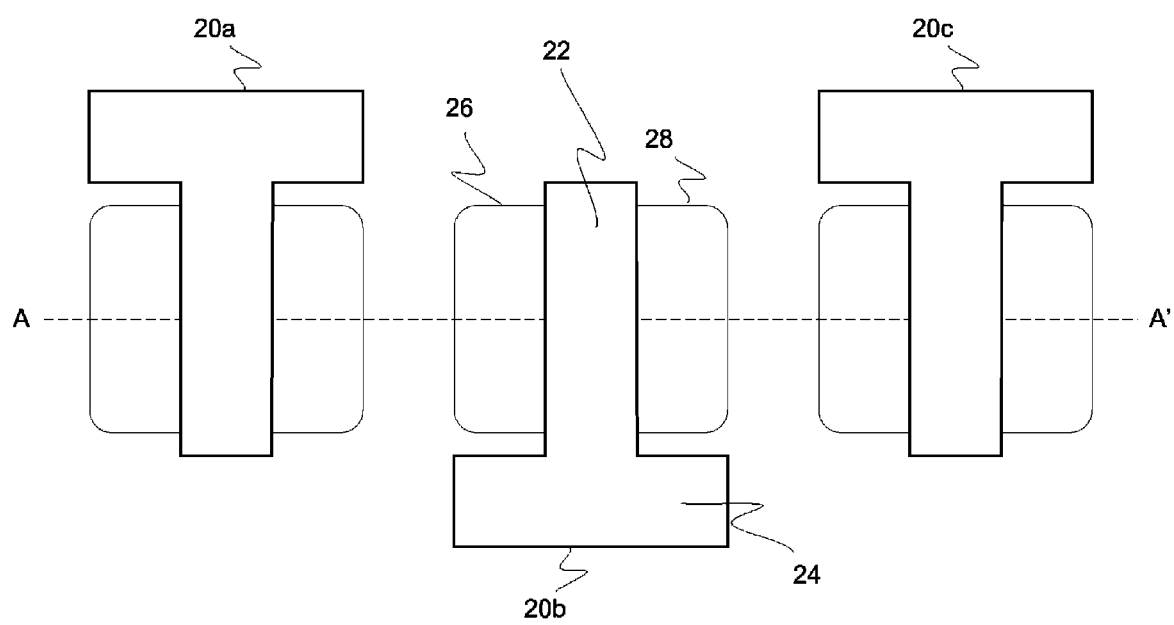
FIG. 3 is a top view of one embodiment of the semiconducting thin film structure of FIG. 2.

FIG. 3 shows an exemplary top view of the patterned structures 20a-20c formed from the contacting step. Such structures may form a transistor gate 22 and a pad 24. Transistor gate 22 may have a first transistor source/drain terminal 26 and a second transistor source/drain terminal 28 on opposing sides thereof, relative to a long axis of the gate. Transistor source/drain terminals 26 and 28 (which may also be formed by the present printing and curing steps) are generally formed in an earlier step of an overall process for making thin film transistors (TFTs). Gate dielectric and field dielectric structures (not shown) may be formed in conventional locations according to conventional techniques or by a printing technique. Pad 24 may comprise an appropriate location for formation of a via or contact to an overlying layer of metallization (which may be subsequently formed by conventional methods or by the present printing and curing steps).

Figure 4:
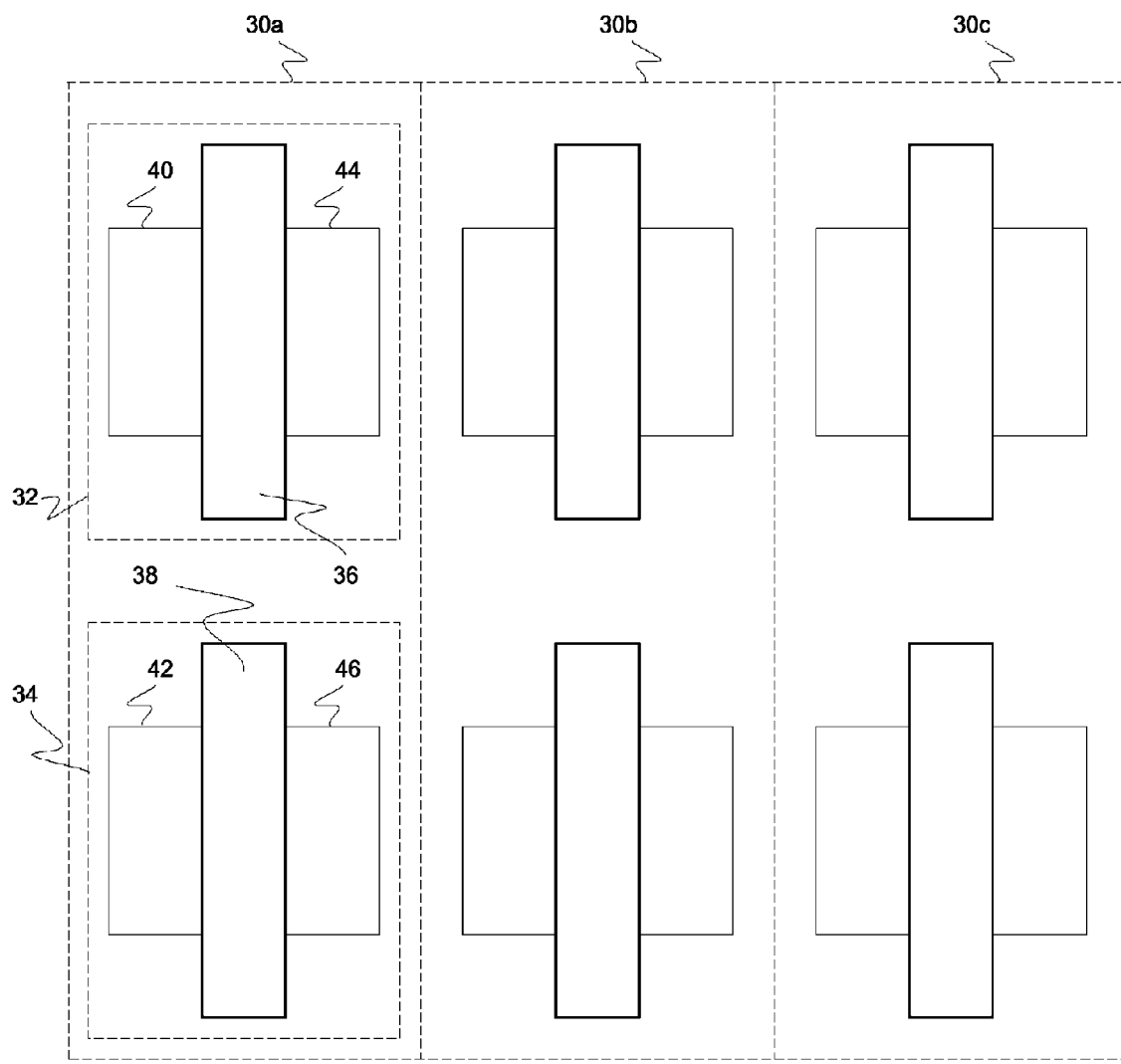
FIG. 4 is a top view of a second embodiment of the semiconducting thin film structure of FIG. 2.

As shown in FIG. 4, the present process may be used to form a complementary CMOS transistor pair 30a, 30b or 30c. For example, complementary CMOS transistor pair 30a comprises a PMOS transistor 32 and an NMOS transistor 34, each of which respectively includes gate 36 and 38, first source/drain terminal 40 and 42, and second source/drain terminal 44 and 46. The transistors in FIG. 4 omit the pad 24.

Each source/drain terminal, each gate and each transistor channel below each gate and between a corresponding set of first and second source/drain terminals are doped with a conventional dopant element, at a conventional doping level and/or in a conventional doping amount/concentration. However, in such a structure, q is at least 1, R or R' in at least part of the cyclic Group IVA compound of the formula (2) is $BH_sR''_{2-s}$, $PH_sR''_{2-s}$, and/or $AsH_sR''_{2-s}$ (where s and R'' are as described above), or the composition further comprises a compound of the formula $(ZH_uR_{3-u})_k$, where Z is selected from the group consisting of B, P and As, u is an integer of from 0 to 3, k is 1 or 2, and R is as described above. Preferably R is R'', more preferably H or $AH_3$. Preferably, u is 0 or 3, more preferably 3. One skilled in the art is easily able to determine and/or calculate the molar and/or weight percentages and/or amounts of passivated semiconductor nanoparticles and the first and second cyclic Group IVA compounds that provide conventional doping levels. However, relative to conventionally doped semiconductor thin films, the present doped semiconductor thin film may have a uniform dopant distribution and/or a dopant concentration gradient. In other words, the dopant concentration as a function of the depth of the film can be constant or can vary according to a desired profile.

The printing step in the present method may alternatively comprise the substeps of depositing a layer 16 of the composition on the substrate 10 or 20, selectively irradiating portions of the layer with light having a wavelength and/or intensity sufficient to oligomerize or polymerize those portions of the composition, and subsequently removing non-irradiated portions of the layer with a suitable solvent to form the pattern. The substep of selectively irradiating the composition layer may comprise (i) positioning at least one of the substrate and a mask such that the portions of the composition that will form the patterned structures can be selectively irradiated, and the non-irradiated portions (i.e., corresponding to the areas of the layer to be removed) cannot be irradiated, then (ii)

irradiating the layer with ultraviolet light through the mask. The mask, which is conventional, is generally one that absorbs light of a wavelength or wavelength range used for the irradiating substep.

Preferred UV radiation sources include those with an emission at 254 nm (e.g., a conventional handheld UV-lamp, an Hg lamp, etc.), as are known in the art. In one embodiment, a patterned semiconductor film can be generated by irradiating the uncured film of the cyclic Group IVA compounds/nanoparticle composition with UV light through a mask, converting the irradiated cyclic Group IVA compounds to an insoluble polymer, and leaving the non-irradiated cyclic Group IVA compounds essentially unchanged. On developing this layer with a suitable solvent (see the cleaning step below), the unexposed areas will be washed away, whereas the exposed areas remain relatively intact.

In such embodiments of the present method, the depositing substep may comprise spin coating a solution, emulsion or suspension of the composition on the substrate. Furthermore, the printing step may further comprise the substep of aligning the mask to an alignment mark on the substrate or aligning the stamp to an alignment structure in a printing apparatus. Further detailed description of exemplary stamps and printing apparatus using such stamps can be found in U.S. patent application Ser. Nos. 10/251,103, 10/288,357 and 10/288,359, and a detailed description of an exemplary alignment structure and method using such a stamp can be found in U.S. patent application Ser. No. 10/171,745, filed Jun. 13, 2002 and entitled "Method of and Apparatus for Aligning a Printing Element to a Substrate", each of which is incorporated herein by reference in its entirety.

In a further alternative, and as shown in co-pending U.S. patent application Ser. No. 10/007,122, the printing step may comprise positioning a stencil on or over the substrate, and depositing a patterned layer of the composition in a solvent through the stencil onto the substrate. A detailed description of exemplary stencils, and printing apparatus and methods using such stencils, can be found in U.S. patent application Ser. No. 10/007,122, filed Dec. 4, 2001 and entitled "Micro Stencil", which is incorporated herein by reference in its entirety. Also, the printing step may comprise inkjet printing the composition in a solvent in the pattern onto the substrate, in accordance with conventional inkjet printing techniques.

Typically, curing times may vary from 10 seconds to 60 minutes (preferably 30 seconds to 30 minutes) depending on the applied temperature and the desired film characteristics (e.g., impurity level, density or extent of densification, level or percentage of crystallinity, doping levels, doping profile, etc.) The curing step in the present method may comprise (i) drying the composition and the substrate, and/or (ii) heating the composition. In certain implementations, the curing step further comprises (a) placing the substrate into a chamber, and evacuating the chamber; (b) passing an inert or reducing gas into the chamber; (c) removing solvent from the composition (see, e.g., U.S. patent application Ser. Nos. 10/288,357 and 10/288,359, incorporated herein by reference in their entireties); (d) irradiating the composition to immobilize the printed layer; and/or (e) heating the patterned composition. Preferably, the present printing method comprises an irradiating step, which may avoid a subsequent developing step since the printing step already provides a patterned film.

The curing step may comprise a "polysilane" formation phase or step, and a nanoparticle sintering phase or step. The term "polysilane" is used as a convenient notation for any polymer of silane, germane, or combination thereof, as is contemplated by the present invention. Conversion of the mixture of first and second cyclic Group IVA compounds to form a doped or undoped polysilane, polygermane, poly(germa)silane or poly(sila)germane generally occurs at a temperature around or above 100° C. in the absence of an additional initiator. A conventional radical initiator, such as 2,2'-azobisisobutyronitrile (AIBN), 1,1'-azobiscyclohexanecarbonnitrile, dibenzoylperoxide, butyl lithium, silyl potassium or hexamethyldisilane (and others) may lower the temperature for polysilane formation to below 100° C. Other methods to catalyze the formation of polysilanes from the first and second cyclic Group IVA compounds include adding known transition metal complexes such as cyclopentadienyl complexes of early transition metals such as Ti and V (and known derivatives thereof). The amount of radical initiator added can vary from 0.00001 mol % to 10 mol % with respect to the first cyclic Group IVA compound.

Sintering of the passivated semiconductor nanoparticles generally occurs at a temperature above 200° C., more preferably above 300° C., and most preferably above 400° C. To lower the sintering temperature, average particle sizes below 10 nm are preferred, more preferably below 5 nm, as described above. Such small nanoparticles may lower the effective sintering temperature range to below 300° C. In the present composition, the low polysilane formation temperature may also fix the nanoparticles (or, alternatively, render the embedded nanoparticles insoluble) at a temperature at which no significant sintering occurs.

As mentioned above, curing (polymer formation and/or sintering) preferably takes place in an inert or reducing atmosphere. Suitable inert atmospheres may include one or more oxygen-free inert gases, such as nitrogen and the noble gases (He, Ne, Ar, Kr, Xe). Reducing atmospheres generally comprise a reducing gas (such as hydrogen, methane, ammonia, phosphine, silane, germane, or a mixture thereof) or a mixture of one or more reducing gasses with one or more inert gasses.

Preferred curing conditions for films formed from compositions comprising alkyl-capped silicon nanoparticles and/or cyclic Group IVA compounds of the formula (s) (1) and/or (2) include curing at 400° C. or higher and in the presence of a reducing atmosphere such as an Argon/Hydrogen mixture. Such conditions are believed to remove hydrogen and carbon-containing species from the film effectively and/or at a suitable rate. However, in such a case, subsequent lower-temperature annealing of a silicon film formed from such cured compositions may dramatically improve the film's electrical characteristics. The lower-temperature annealing is generally conducted in a reducing atmosphere (preferably in an argon-hydrogen mixture, more preferably containing $\leq 10\%$ $H_2$ by weight or moles, and in one implementation, 5 wt. % $H_2$), at a temperature in the range of from 250° C. to 400° C., preferably from about 300° C. to about 350° C., for a length of time of from 1 to 120 minutes, preferably from about 10 to about 60 minutes, and in one implementation about 30 minutes.

After curing or sintering, the method may further comprise cleaning the substrate with the patterned semiconductor thin film thereon, for example to remove uncured ink. This step may comprise rinsing with or immersing the substrate in a solvent, draining the solvent from the substrate, and drying the substrate and patterned semiconductor thin film. Solvent rinsing or washing may include the same procedure(s) as are typically used in photoresist development and/or photoresist etching (e.g., rinsing, immersing, spraying, vapor condensation, etc.). Preferred solvents include solvents in which the unsintered nanoparticles and unpolymerized cyclic Group IVA compounds have a high solubility, such as the hydrocarbons and ethers described above for the exemplary ink solvent.

In preferred embodiments, the pattern comprises a two-dimensional array of lines having a width of from 100 nm to 100 µm, preferably from 0.5 µm to 50 µm, and more preferably from 1 µm to 20 µm. For example, as shown in FIG. 3, the lines may comprise a first set of parallel lines along a first axis, and a second set of parallel lines along a second axis perpendicular to the first axis. Although parallel and perpendicular lines are shown (in part to minimize adverse effects from and/or maximize the predictability of the effect of electromagnetic fields from adjacent lines), lines may take any shape and/or take any course that can be designed and printed.

The lines may have an inter-line spacing of from 100 nm to 100 µm, preferably 200 nm to 50 µm, more preferably 500 nm to 10 µm. Furthermore, at least a subset of the lines may have a length of from 1 µm to 5000 µm, preferably 2 µm to 2000 µm, more preferably 5 µm to 1000 µm, and a thickness of from 0.001 µm to 1000 µm, preferably 0.01 µm to 500 µm, more preferably 0.05 µm to 250 µm.

In an alternative embodiment, the method comprises (i) at least partially curing a thin film composition comprising semiconductor nanoparticles to form a semiconductor thin film lattice, (ii) coating the semiconductor thin film lattice with a composition comprising at least one cyclic Group IVA compound of the formula (1) and/or the formula (2) above, and (iii) curing the coated thin film lattice to form a semiconducting thin film. In preferred embodiments, (i) the composition comprises both of the first and second cyclic Group IVA compounds, and/or (ii) the semiconductor nanoparticles comprise passivated semiconductor nanoparticles or silicon nanoparticles (more preferably passivated silicon nanoparticles as described above).

In general, individual steps in this alternative process (e.g., printing, depositing, coating, curing, etc.) may be performed as described above for the first exemplary method. For example, this alternative process may comprise the steps of: (a) printing a first composition comprising semiconductor nanoparticles, (b) at least partially curing the first composition to form a patterned semiconductor thin film lattice, (c) printing or depositing a second composition comprising at least one cyclic Group IVA compound of the formula (1) and/or the formula (2) on at least the patterned semiconductor thin film lattice to form a coated thin film lattice, and (d) curing the coated thin film lattice to form a patterned semiconducting thin film. When the second composition is deposited non-selectively on the patterned semiconductor thin film lattice and any underlying substrate (e.g., by spin coating, vapor deposition, or another coating process that forms a continuous layer), one may remove cured cyclic Group IVA compound(s) by conventional isotropic (directional) etching. Alternatively, one may remove uncured cyclic Group IVA compound(s) by conventional developing techniques (e.g., solvent-based removal as described above), as long as one allows or promotes absorption, incorporation and/or intercalation of the Group IVA compound(s) into the semiconductor thin film lattice (e.g., by coating the thin film lattice under a vacuum, such as about 200 mTorr or less, preferably about 100 mTorr or less, and/or exposing the coated thin film lattice to a pressure greater than atmospheric pressure, such as 3-4 atm or more, preferably 5 atm or more; or simply allowing the coated composition to sit under an inert or reducing atmosphere for a length of time sufficient to at least partially fill spaces in the lattice). However, this alternative method is not limited to producing a printed or patterned composition, which is then cured to produce a printed or patterned semiconducting thin film. Rather, this alternative method may be advantageously utilized in combination with subsequent processing by conventional lithography, which may provide finer line widths, inter-line or inter-feature spacings and/or reduced film thicknesses. For example, in a further embodiment, the method may comprise irradiating the Group IVA compound(s) with ultraviolet light during the coating (preferably, spin coating) step.

In a further alternative, the method comprises (i) at least partially curing a thin film composition comprising at least one cyclic Group IVA compound of the formula (1) and/or the formula (2), (ii) coating the (partially) cured thin film composition with an ink comprising semiconductor nanoparticles, and (iii) curing the coated, (partially) cured thin film composition to form a semiconducting thin film. Preferably, in this embodiment, the thin film composition is fully cured to form a hydrogenated, at least partially amorphous Group IVA element (as described above), and the thin film composition and the ink may be printed or uniformly coated onto the substrate and processed by conventional photolithography. This alternative method may improve interface quality to the gate dielectric in a bottom gate TFT.

In more detailed embodiments, the semiconductor nanoparticles are at least partially cured when heated to a temperature and/or for a length of time sufficient to remove passivation and begin forming covalent bonds between nanoparticles. Such heating is generally conducted under an inert or reducing atmosphere (as described above), and may take place under a vacuum (e.g., less than or about 100 Torr, preferably less than or about 10 Torr, more preferably less than or about 1 Torr) or in a flow of inert or reducing gas. More generally, the semiconductor nanoparticles are cured by sintering under conditions such as those described above for the exemplary compositions to form the semiconductor thin film lattice. For example, sintering may comprise heating the semiconductor nanoparticles composition to a temperature of at least about 200° C., preferably at least about 300° C. A similar process (and discussion) applies to curing the coated semiconductor thin film lattice to form the semiconducting thin film (e.g., curing step (c) comprises sintering).

The method may further comprise patterning the semiconductor and/or semiconducting thin film, largely by conventional photolithography. Thus, the method may further comprise the substeps of depositing a layer of photoresist on the semiconducting thin film (preferably by one of the depositing techniques described above), selectively irradiating portions of the photoresist, removing desired portions of the photoresist (either irradiated or non-irradiated, depending on the type of photoresist), and removing exposed portions of the semiconductor and/or semiconducting thin film to form a patterned semiconducting thin film.

Exemplary Semiconducting Thin Film Structures

A further aspect of the invention relates to a semiconducting thin film structure comprising a pattern of semiconducting material on a substrate, the semiconducting material comprising a sintered mixture of semiconductor nanoparticles in a hydrogenated, at least partially amorphous Group IVA element, the Group IVA element comprising at least one of silicon and germanium, the semiconducting material having improved conductivity, density, adhesion and/or carrier mobility relative to an otherwise identical structure made by an identical process, but without either the passivated semiconductor nanoparticles or the mixture of first and second cyclic Group IVA compounds. Mixing semiconductor nanocrystals with first and/or second cyclic Group IVA compounds of the formulas (1) and (2) helps to densify the semiconductor thin film, thereby reducing the amount or density of "traps" in the film. This may lower the curing temperature required to obtain a certain film performance (e.g., conductivity, adhesion, carrier mobility, etc.), or a certain desired or predetermined value for a particular film parameter (e.g., density, surface roughness, etc.). In either case, when used to form a TFT, the present composition may increase the carrier mobility as well as the transistor stability. The first and/or second cyclic Group IVA compounds of the formulas (1) and (2) may also help improve the quality of the thin film interface to adjacent oxide, for example by improving planarization of the semiconductor thin film. Improved adherence to an underlying substrate may also be provided, possibly by increasing the surface area of the film that makes chemical and/or physical contact with the underlying substrate.

Doping of the semiconductor thin film by mixing nanoparticles with a cyclic Group IVA compound containing a conventional dopant element may be facilitated by the tendency of the nanoparticles to grow and sinter during curing. The presence of a dopant bound to Group IVA atoms during this process may improve the probability that dopant atoms get incorporated into the silicon lattice during the nanoparticles' growth and/or densification. The covalent bond between dopant atom and Group IVA atom may also alleviate any need for recrystallization-based activation of the dopant, as often occurs in conventional implantation processes.

In the present thin film structure, the semiconductor nanoparticles preferably comprise silicon nanoparticles, and the hydrogenated (at least partially) amorphous Group IVA element preferably comprises amorphous silicon. As described above, the semiconductor/silicon nanoparticles may be passivated with alcoholate, thiolate, hydrogen, halogen, alkyl groups, etc. When passivated with alkyl groups, the semiconductor/silicon nanoparticles may be more soluble in a nonpolar and/or aprotic solvent than are otherwise identical semiconductor/silicon nanoparticles passivated with a surfactant.

Also, either or both of the nanoparticles and the hydrogenated amorphous Group IVA element may further comprise a dopant (e.g., B, P or As) covalently bound to Group IVA atoms. In such a case, the dopant concentration profile or gradient may be substantially uniform throughout the entire thickness of the semiconductor thin film. However, in the case where the hydrogenated amorphous Group IVA element further comprises a dopant but the semiconductor nanoparticles do not, the sintered thin film may comprise small crystalline phases or regions (preferably less than about 5 nm average diameter, more preferably less than about 3.5 nm average diameter) that are substantially free of dopant, but are embedded in a matrix of uniformly doped semiconducting material.

In another embodiment, the sintered thin film may have a controlled doping profile; for example, it comprises multiple layers of differently doped silicon. In one embodiment, a bottom layer may comprise one of p-doped silicon (i.e., where the composition comprises a compound of the formula (2) in which q is at least 1 and Z is B) or n-doped silicon (i.e., where the composition comprises a compound of the formula (2) in which q is at least 1 and Z is P or As), a second layer thereon may comprise the other of p-doped silicon or n-doped silicon, an optional third layer on the second layer that comprises silicon having the same dopant type (p-doped or n-doped) as the bottom layer, in which the dopant may be present in the same, a higher or a lower concentration than the bottom layer, an optional fourth layer on the third layer that comprises silicon having the same dopant type (p-doped or n-doped) as the second layer, in which the dopant may be present in the same, a higher or a lower concentration than the second layer, and so on. Alternatively, the sintered thin film may comprise lightly doped silicon (i.e., where the composition comprises a compound of the formula (2) in which q is at least 1, in an amount or percentage by weight or moles sufficient to provide, e.g., from $10^{-10}$ to $10^{-7}$ moles of dopant per mole of Group IVA element) and a layer or region of heavily doped silicon (e.g., where the compound of the formula (2) in which q is at least 1 is present in an amount or percentage by weight or moles sufficient to provide, e.g., from $10^{-7}$ to $10^{-4}$ moles of dopant per mole of Group IVA element) of the same dopant type. Such a structure may further comprise (i) a layer or region of oppositely doped silicon above it, below it and/or adjacent to it, and/or (ii) a layer or region of very heavily doped silicon (e.g., where the compound of the formula (2) in which q is at least 1 is present in an amount or percentage by weight or moles sufficient to provide, e.g., from $10^{-4}$ to $10^{-3}$ moles of dopant per mole of silicon) above it and/or adjacent to it.

In a further embodiment, the semiconducting thin film may comprise one or more layers in a thin film transistor (TFT). In yet another embodiment, the semiconducting thin film may be used for a photovoltaic device. For instance, a photovoltaic device may be made by the above process, but with a film thicknesses of from 1 to 1000 microns, preferably 5 to 500 microns, whereas the preferred thickness for a TFT is from 10 to 500 nm, more preferably 50-100 nm.

The pattern of the present thin film structure has been described in part above with regard to the present method. However, in a preferred embodiment, the present thin film structure pattern comprises a two-dimensional array of lines having a width of from 100 nm to 100 μm, more preferably from 0.5 μm to 50 μm, and even more preferably from 1 μm to 20 μm. The lines may have an inter-line spacing of from 100 nm to 100 μm, preferably from 0.5 μm to 50 μm, more preferably from 1 μm to 20 μm. The thin film pattern lines may also have a length of from 1 μm to 5000 μm, at least a subset of the lines preferably having a length of from 2 μm to 1000 μm, more preferably from 5 μm to 500 μm. The lines may have a thickness of from 0.001 μm to 1000 μm, preferably from 0.005 μm to 500 μm, more preferably from 0.05 μm to 100 μm.

CONCLUSION

Summary

Thus, the present invention provides a patterned semiconducting thin film structure and a composition, ink and method for making semiconductor and/or semiconducting thin films. It is also envisioned that the present composition and method can be used for other thin film structures, such as corresponding oxides of Group IVA elements (e.g., silicon dioxide). For example, a polysilane precursor (e.g., where A=Si) may be well suited as a precursor for silicon oxide as a gate dielectric. In this application, one may deposit the present composition (with or without the passivated nanoparticles, and preferably without), curing it in an oxidizing atmosphere (see below) or converting it to an amorphous and/or crystalline silicon film as described above and oxidizing subsequently. Means of oxidation include exposure to air, molecular oxygen in an inert gas carrier, water vapor, ozone, etc., in accordance with known techniques.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of making passivated semiconductor nanoparticles, comprising:
    a) reacting hydrogen-terminated semiconductor nanoparticles with a compound containing one or more unsaturated carbon-carbon bond(s) to form said passivated semiconductor nanoparticles; and
    b) isolating said passivated semiconductor nanoparticles.

2. The method of claim 1, wherein said hydrogen-terminated semiconductor nanoparticles comprise one or more crystalline region(s) and/or phase(s).

3. The method of claim 2, wherein said hydrogen-terminated semiconductor nanoparticles further comprise one or more amorphous region(s) and/or phase(s).

4. The method of claim 1, wherein said hydrogen-terminated semiconductor nanoparticles comprise silicon and/or germanium.

5. The method of claim 4, wherein said hydrogen-terminated semiconductor nanoparticles further comprise a dopant.

6. The method of claim 1, wherein said compound containing one or more unsaturated carbon-carbon bond(s) includes a carbon-carbon double bond.

7. The method of claim 6, wherein said compound including a carbon-carbon bond double bond comprises one or more compound(s) selected from the group consisting of polyunsaturated alkenes.

8. The method of claim 7, wherein said polyunsaturated alkene comprises an alkadiene.

9. The method of claim 7, wherein said polyunsaturated alkene is present in an amount of from about 1 to 10 mol %.

10. The method of claim 1, wherein said compound containing one or more unsaturated carbon-carbon bond(s) includes one or more compound(s) selected from the group consisting of $C_4$-$C_{20}$ branched or unbranched alkenes.

11. The method of claim 1, wherein said compound comprises an unsaturated alcohol.

12. The method of claim 1, wherein said passivated semiconductor nanoparticles have an average diameter of less than 5 nm.

13. The method of claim 12, wherein said passivated semiconductor nanoparticles have an average diameter of less than 4 nm.

14. The method of claim 13, wherein said passivated semiconductor nanoparticles have an average diameter of less than 3.5 nm.

15. The method of claim 1, wherein said passivated semiconductor nanoparticles have a size distribution range such that at least 90% of the passivated silicon nanoparticles have a diameter of from 0.1 nm to 10 nm.

16. The method of claim 15, wherein said passivated semiconductor nanoparticles have a diameter of from 0.2 nm to 5 nm.

17. The method of claim 16, wherein said passivated semiconductor nanoparticles have a diameter of from 0.5 nm to 5 nm.

18. The method of claim 15, wherein at least 95% of the passivated silicon nanoparticles have a diameter of from 0.1 nm to 10 nm.

19. The method of claim 18, wherein at least 98% of the passivated silicon nanoparticles have a diameter of from 0.1 nm to 10 nm.

20. The method of claim 1, wherein said passivated semiconductor nanoparticles comprise soluble passivated semiconductor nanoparticles.

21. The method of claim 1, wherein said passivated semiconductor nanoparticles consist essentially of silicon and a passivation layer consisting essentially of said compound.

* * * * *